United States Patent [19]

Azevedo et al.

[11] Patent Number: 4,868,514
[45] Date of Patent: Sep. 19, 1989

[54] APPARATUS AND METHOD FOR DIGITAL COMPENSATION OF OSCILLATOR DRIFT

[75] Inventors: Michael J. Azevedo, San Jose, Calif.; Charles A. Corchero, Tucson, Ariz.; Donald J. Lang, Cupertino; Gilbert R. Woodman, Jr., San Jose, both of Calif.

[73] Assignee: International Business Machines Corporation, Armonk, N.Y.

[21] Appl. No.: 121,667

[22] Filed: Nov. 17, 1987

[51] Int. Cl.$^4$ ................ H03K 5/13; H03K 5/159; H03K 17/28; H03L 7/00

[52] U.S. Cl. .................... 328/155; 328/55; 328/134; 307/511; 307/525; 307/269; 307/603; 331/25; 331/51; 331/DIG. 2

[58] Field of Search ............ 328/25, 30, 55, 63, 328/7 E, 105, 133, 134, 155, 179; 307/511, 518, 525, 527, 269, 602, 603; 331/DIG. 2, 25, 46, 47, 48, 51, 177 R, 177 V, 178, 179, 55

[56] References Cited

U.S. PATENT DOCUMENTS

| | | | |
|---|---|---|---|
| 3,440,546 | 4/1969 | Nelson | 328/56 |
| 3,505,478 | 4/1970 | Kaneko | 179/15 |
| 3,593,158 | 7/1971 | Day et al. | 328/55 |
| 3,599,011 | 8/1971 | Zwolle | 307/223 |
| 4,019,143 | 4/1977 | Fallon et al. | 328/71 |
| 4,025,874 | 5/1977 | Abbey | 331/55 |
| 4,051,440 | 9/1977 | Nelson et al. | 328/134 |
| 4,055,814 | 10/1977 | Abraham et al. | 331/1 A |
| 4,065,796 | 12/1977 | Dehart | 360/51 |
| 4,105,932 | 8/1978 | Cleary, Jr. et al. | 315/377 |
| 4,124,820 | 11/1978 | Arnstein | 328/55 |
| 4,137,503 | 1/1979 | Ziesmer | 328/155 |
| 4,142,158 | 2/1979 | Belisomi | 325/464 |
| 4,165,490 | 8/1979 | Howe, Jr. et al. | 328/60 |
| 4,282,493 | 8/1981 | Moreau | 331/DIG. 2 |
| 4,290,022 | 9/1981 | Puckette | 328/55 |
| 4,316,148 | 2/1982 | Kaminski | 328/55 |
| 4,338,569 | 7/1982 | Petrich | 328/155 |
| 4,386,323 | 5/1983 | Jansen | 328/63 |
| 4,412,342 | 10/1983 | Khan et al. | 375/107 |
| 4,479,216 | 10/1984 | Krambeck et al. | 371/61 |
| 4,511,859 | 4/1985 | Dombrowski | 331/25 |
| 4,514,647 | 4/1985 | Shoji | 307/269 |
| 4,524,448 | 6/1985 | Hullwegen | 375/118 |
| 4,533,879 | 8/1985 | Sauer et al. | 331/25 |
| 4,546,269 | 10/1985 | Johnson | 307/269 |
| 4,560,939 | 12/1985 | Dekarske et al. | 328/155 |
| 4,682,121 | 7/1987 | Chapman | 331/1 A |
| 4,698,600 | 10/1987 | Chapman | 331/1 A |
| 4,713,621 | 12/1987 | Nakamura et al. | 307/269 |
| 4,754,174 | 6/1988 | Matthies | 328/109 X |

OTHER PUBLICATIONS

"Synchronization of LSSD System Clocks to Asynchronous Signals," by E. N. Hayes and M. A. Orr, IBM Technical Disclosure Bulletin, vol. 27, No. 8, Jan. 1985.
"Computer Clock Distribution System with Programmable Delay and Automatic Adjustment," by G. Koetzle, IBM Technical Disclosure Bulletin, vol. 18, No. 6, 11/75.

Primary Examiner—Stanley D. Miller
Assistant Examiner—Huy Kim Mai
Attorney, Agent, or Firm—Baker, MAxham, Jester & Meador

[57] ABSTRACT

This disclosure concerns digital correction of oscillator drift by providing phase alignment between two clock signals running at nearly the same frequency. Phase alignment is provided by fashioning a delay for one of the clock signals through selection of various lengths of a variable delay path formed from a series of logic circuits. Respective reference signals are derived from the two clocks to be phase-aligned, and the phases of the references are compared in a digital phase comparator. The product of phase comparison controls a digital delay selector to generate a sequence of delay signals corresponding to a sequence of detected phase differences. The delay signal sequence controls the variable digital delay. The variable digital delay outputs a corrected clock signal whose phase is aligned with the phase of the other clock signals. The corrected clock signal is used to produce one reference signal, the other reference signal being derived directly from the other clock signal. A second digital phase comparator compares the phase of the corrected clock signal with a predetermined reference phase of the clock signal from which it is derived. When the phases of the clocks are aligned, the second comparator produces a reset signal which resets the digital selection circuit to a predetermined point in the delay signal sequence, thereby operating the variable digital delay to correct the clock signal to a phase corresponding to the predetermined reference phase.

9 Claims, 5 Drawing Sheets

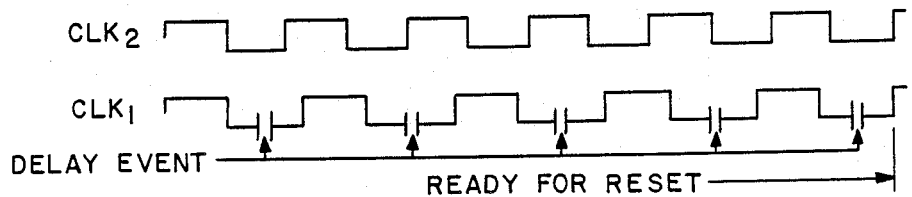
FIG. 1
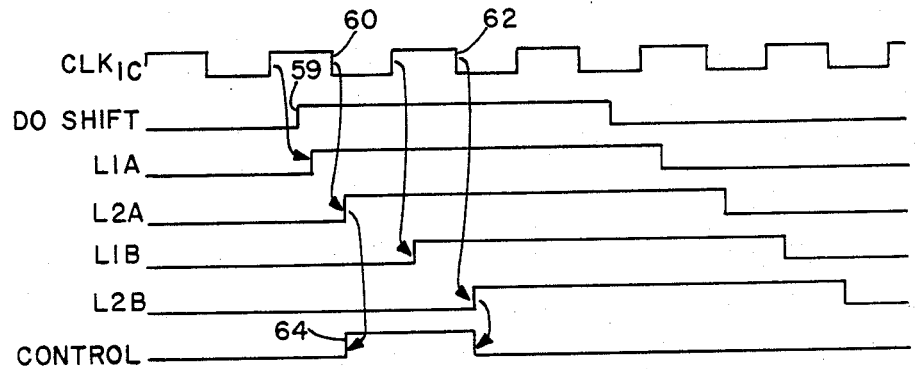
FIG. 2
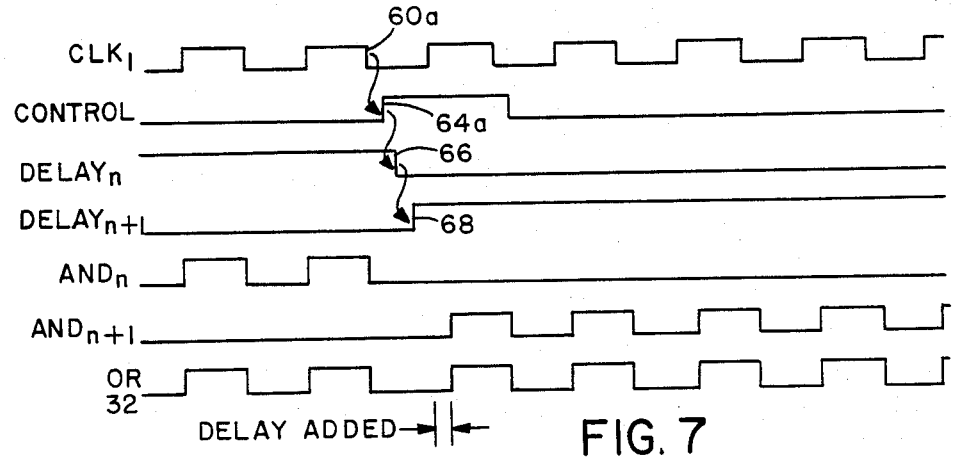
FIG. 6
FIG. 7

APPARATUS AND METHOD FOR DIGITAL COMPENSATION OF OSCILLATOR DRIFT

BACKGROUND OF THE INVENTION

The invention relates to phase alignment of clock signals operating at nearly equal frequencies.

A variety of means and procedures for compensation or correction of drift between oscillators operating at nearly the same frequency are known. For example in U.S. Pat. No. 4,290,022 of Puckette, a phase shifter detects and corrects for phase difference between a pair of square wave of equal frequency. Phase correction is provided by selective imposition of a variable amount of delay on one of the signals, based upon the difference in phase between it and the other signal No provision, however, is made for "closing the loop" between the corrected signal and the phase detection function in such manner as to support virtually continuously variable phase correction.

Digital phase correction in the prior art finds its most varied expression in data synchronization. For example, U.S. Pat. No. 3,505,478 of Kaneko and U.S. Pat. No. 4,524,448 of Hullwegen both teach synchronization of a clock extracted from data received in a transmission channel to a local clock which is used by a data receiving unit to control local data receiving and decoding operations. In these references, one reference clock signal is extracted from transmitted data. In both patents, a variable delay unit is provided for inserting more or less delay into the received data signal before a reference clock signal is extracted from it. The Hullwegen patent shows closure of a loop in such a manner as to provide for continuous phase correction by a single loop which operates in response to the phase between the clock extracted from the data and the local clock. The Hullwegen circuit does not operate by directly correcting the phase of the clock; rather, it corrects the phase of the data signal from which the clock is extracted. Furthermore, no provision is made for resetting the correction loop when a predetermined amount of delay has been inserted, with the resetting done in such a manner as to make the amount of the delay apparently infinite.

It is therefore an objective of the present invention to compensate for the drift between a pair of clock signals having nearly the same frequency through a digital phase correction circuit which provides an apparently infinite amount of phase correction to align one of the clock signals with the other.

A distinct advantage of the invention is the achievement of this objective by means of a digital circuit which selects the amount of delay through a delay selection loop that operates continuously on the clock signal to be corrected through provision of a reset function.

SUMMARY OF THE INVENTION

The inventors' critical realization underpinning this invention is that the operation of a phase correction loop can be enhanced by provision of a reset function, operable when a predetermined amount of phase correction has been inserted into a compensated clock waveform.

The invention is based upon a digital phase lock loop for phase aligning a first oscillator signal $CLK_1$ having a frequency $f_1$ and a second oscillator signal $CLK_2$, having a frequency $f_2 \approx f_1$. A local digital phase comparator compares the phase of $CLK_2$ with the phase of a corrected oscillator signal $CLK_{1C}$, producing a delay control signal based upon the comparison. A digital selector is connected to the local digital phase comparator to generate delay signals in a delay signal sequence in response to a succession of delay control signals. A variable digital delay circuit receives $CLK_1$ and is connected to the digital selector for producing $CLK_{1C}$ by delaying $CLK_1$ by an amount of time determined by the delay signal sequence. A reset digital phase comparator compares the phase of $CLK_{1C}$ with a reference phase of $CLK_1$ and produces a reset signal when those phases are aligned. Finally, the digital selector responds to the reset digital phase comparator by generating the delay signal at a predetermined point in the delay signal sequence in response to the reset signal.

The invention is also expressed as a method of phase aligning a first oscillator signal $CLK_1$, having a frequency $f_1$, to a second oscillator signal $CLK_2$, having a frequency $f_2 \approx f_1$. Next the phase of $CLK_2$ is compared with the phase of $CLK_{1C}$, a corrected oscillator signal having a frequency $f_1$, following which $CLK_1$ is delayed by an amount of time determined by the first comparison, then, $CLK_{1C}$ is provided based upon the delaying step. The phase of $CLK_{1C}$ is compared with a predetermined reference phase of $CLK_1$ Finally, the amount of time by which $CLK_1$ is delayed is adjusted to a predetermined amount when the phase of $CLK_{1C}$ equals the reference phase of $CLK_1$.

The basic apparatus and procedure thus expressed permit the achievement of phase lock between an external oscillator and a local oscillator running at nearly the same frequency as the external, thus supporting the synchronization of different elements of a machine without the use of analog circuits. This is elaborated in the synchronization of separate LSI chips of a machine by the use of local oscillators which run at approximately the same frequency, without the introduction of a single point of failure in the form of a single clock source. Provision of the invention in each of a pair of digital systems permits the synchronization of the systems without the exposure to a single point of failure in the form of a single clock source for both systems.

The achievement of the above-stated objectives and of other objectives and advantages by the summarized invention will be appreciated when the following detailed description is read with reference to the below-described Figures, in which:

FIG. 1 is a signal diagram illustrating the concept of digital compensation according to the invention;

FIG. 2 is a waveform drawing illustrating the incrementation of delay in a corrected clock waveform according to a continuously cycling sequence;

FIG. 6 is a waveform diagram illustrating the operation of the pulse generator of FIG. 4;

FIG. 7 is a waveform diagram illustrating the operation of the shift synchronizing element of FIG. 5;

DETAILED DESCRIPTION OF THE PREFERRED EMBODIMENTS

With reference now to FIG. 1, the phase of a first conventional clock signal $CLK_1$ is compared with and adjusted to the phase of a second conventional clock signal $CLK_2$. It is asserted that $CLK_1$ has a frequency $f_1$ and that $CLK_2$ has a frequency $f_2$, and that $f_1$ is approximately equal to $f_2$. In the case of FIG. 1, both signals are provided by independent oscillators, with the oscillator producing $CLK_1$ being slightly faster than the other. Further, it is postulated that $CLK_1$ is, by operation of the invention, tracking $CLK_2$ On an oscilloscope, $CLK_1$ will appear to shift leftward relative to $CLK_2$ Continual addition of a unit of delay (D) to CLK will enable $CLK_1$ to stay in synchronization with $CLK_2$ If $f_1$ differs slightly from $f_2$, eventually, $CLK_1$ will again lead $CLK_2$. When this occurs, a second unit of delay is added to the first. Units of delay are accumulated in a sequence of one unit increments; and $CLK_1$ is delayed by an amount of time equal to the accumulated total of unit delays.

Assuming that the frequencies of the two oscillators producing $CLK_1$ and $CLK_2$ do not change, and assuming further that the process of adding a unit of delay D continues indefinitely in an incremental sequence, the eventual result will be to accumulate enough delay units to amount to at least one period of the $CLK_1$ waveform At that time, an amount of delay equal to one period of $CLK_1$ can be removed from the accumulated delay without any evident effect upon the phase relationship of $CLK_1$ and $CLK_2$ Thus an apparent endless amount of delay can be added to the signal output by the faster oscillator. This concept is illustrated in FIG. 2.

In FIG. 2, a corrected oscillator signal $CLK_{1C}$ is produced by incrementing the amount of time by which $CLK_1$ is delayed by a predetermined amount. The time increments are equal, and each increment is referred to as a "delay event." The incremental process corresponds essentially to retarding the phase of $CLK_1$ in a series of discreet steps, with each incrementation resulting in the delay of the positive edge of $CLK_{1C}$ by a predetermined amount. The incremental delays accumulate to the point where the next increment results in $CLK_1$ being delayed by more than one of its own fundamental periods. At this point, the sequence of adding delay events is ready to be reset to a predetermined point. Reset to the predetermined point is effected by removing a number of delay elements corresponding to a fundamental period of $CLK_1$.

Figure 3:
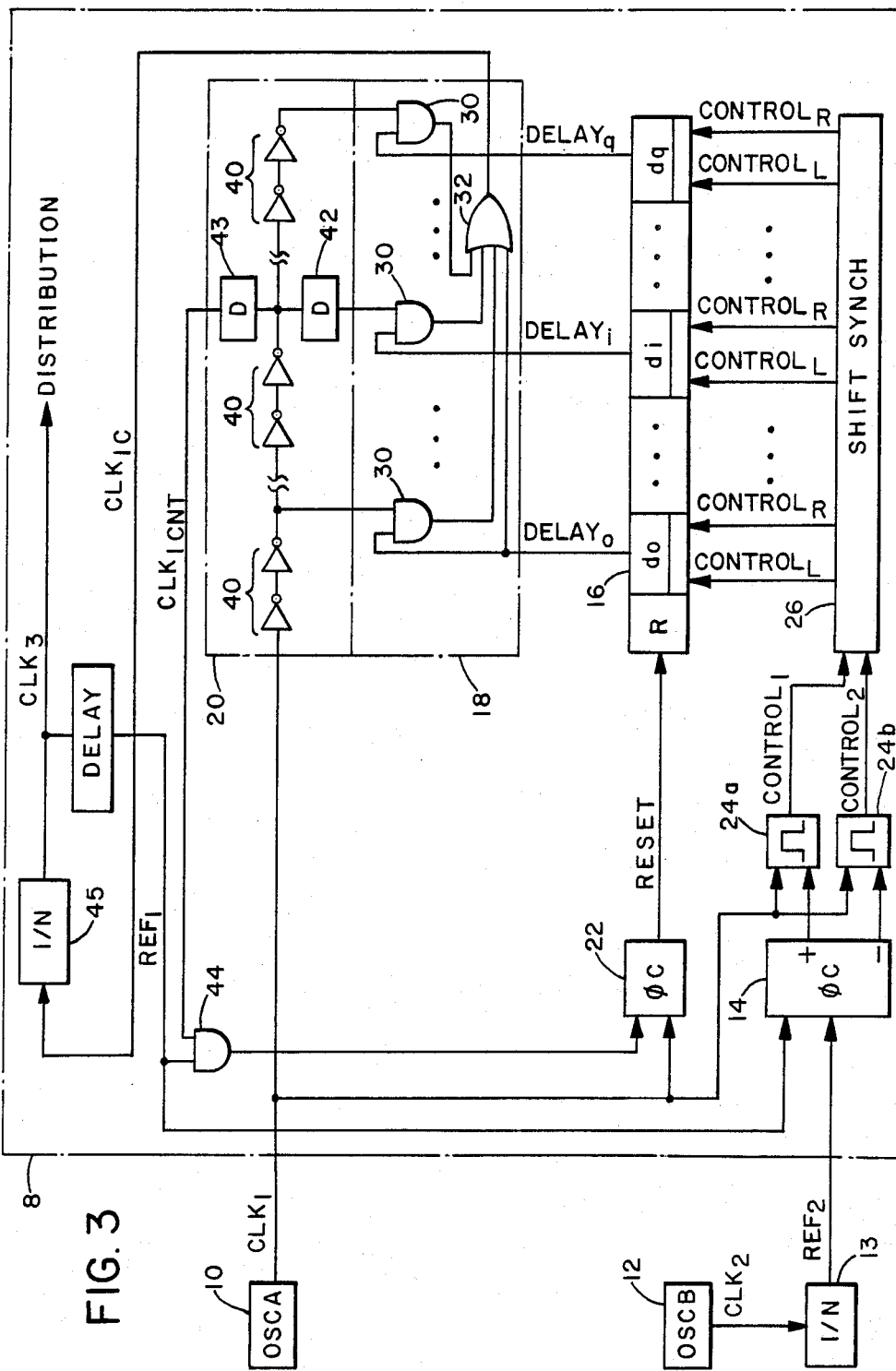
FIG. 3 is a schematic diagram illustrating the fundamental structure of the apparatus of the invention.

The apparatus of the invention which accomplishes this resettable delay incrementation sequence is illustrated in FIG. 3. The apparatus, indicated by reference numeral operates in conjunction with a first oscillator 10 producing $CLK_1$, and a second oscillator 12, producing $CLK_2$ $CLK_2$ is fed to a conventional digital divider 13 which divides $CLK_2$ by N to produce a reference signal $REF_2$ having a frequency $f_{2R} = f_2/N$, where N is understood to be a positive integer, greater than one. The apparatus-8 includes a local digital phase comparator 14 feeding a digital selector consisting of a left/right shift register 16 and gated selection logic 18. The digital selector is connected to a variable digital delay line 20. A reset digital comparator 22 provides a reset signal (RESET) to the left/right shift register 16. The phase comparator 14 indirectly compares the phases of a signal $CLK_{1C}$ and $CLK_2$. The comparator performed the phase comparison on signals derived from $CLK_{1C}$ and $CLK_2$ $REF_2$, described above, is one of those signals. The other, $REF_1$, is obtained, as explained hereinbelow, through dividing $CLK_{1C}$, the phase-shifted representation of $CLK_1$, by N. $REF_1$, thus comprises a signal having a frequency $f_{R1} = f_{1/N}$, which differs from the frequency of $REF_2$ in proportion to the difference between $f_1$ and $f_2$. Since $REF_1$ and $REF_2$ are derived directly from $CLK_{1C}$ and $CLK_2$, respectively, it will be evident that any phase difference existing between the outputs of the oscillators 10 and 12 will be represented by an equivalent phase difference between $REF_1$ and $REF_2$. This phase difference is detected in the phase comparator 14. The phase comparator 14 can comprise a conventional digital comparator, such as a polarity hold latch, which compares negative transitions on $REF_1$ and $REF_2$.

The measured phase difference measured by the local comparator 14 is indicated by a pair of outputs, one indicating a positive difference (+) when $REF_1$ leads $REF_2$ and a second output (−) when $REF_1$ lags $REF_2$. The difference signals are fed through respective pulse generators 24a and 24b, either of which produces a CONTROL pulse provided to a shift synchronizer 26. The shift synchronizer 26 operates to synchronize the provision of a respective CONTROL pulse to the left/right shift register 16 with the transitions of $CLK_1$. The synchronized CONTROL pulses are presented to the shift register 16 as left shift signals ($CONTROL_L$) or right shift ($CONTROL_R$) signals.

The shift register 16 is a conventionally structured sequence of serially-connected storage elements $d_o$–$d_q$, each shifting to an adjacent element in a direction determined by the CONTROL signal provided the shifting element. In addition, the storage element sequence is resettable by provision of a RESET signal to a predetermined configuration. Those skilled in the art will recognize that the shift register 16, thus described, conforms essentially to a shuttle counter which counts up or down by moving a single token signal to the left or to the right in the shift register 16. Further, upon the provision of the RESET signal, the shift register 16 is configured to place the token signal at a predetermined preset location anywhere in the serial sequence of storage elements. In FIG. 3, the RESET signal causes the token to be set to the center of the storage element sequence, represented by storage element $d_i$.

Over time, as a series of phase comparisons made by the comparator 14 results in the provision of a corresponding series of CONTROL signals, movement of the token signals in the shift register 16 will cause the register to output a corresponding sequence of DELAY signals. The DELAY signal sequence is denoted as $DELAY_o$–$DELAY_q$.

The DELAY signals are fed to the second element of the digital selector represented by the logic circuit 18. The logic circuit 18 includes a plurality of conventional, two-input AND gates 30, each connected to receive a respective one of the DELAY signals output by the register 16 The outputs of the AND signals are collected in a conventional OR circuit 32 having $q+1$ inputs.

The variable digital delay circuit 20 consists of a serially-connected sequence of equivalent delay elements 40. Each of the lumped delay elements 40 comprises a conventional integrated circuit element. In the embodiment of FIG. 3, each delay element consists of a series of two inverters. Every delay element will thus impose on a signal a determinable delay having a magnitude equal to the delay of any other delay element 40. Each delay element output represents a respective tap point of the delay circuit 20. Each tap represents a time or phase delay equivalent to the sum of element delays downstream in the delay circuit. The output of every delay element 40, save the last, is connected to the input of the next delay element and to the input of a respective one of the AND gates 30. The output of the last delay element is connected only to the input of the last AND gate of the logic 18. The sole other exception is the output of the centermost delay element, which is connected to the centermost AND gate 30 through a lumped delay element 42 and also, through a lumped delay element 43 to an AND gate 44.

The output of the logic circuit 18 is provided through the output of the OR gate 32 and is connected to a conventional digital divider circuit 45, equivalent in all respects to the circuit 13. The divider circuit 45 divides the output of the OR circuit 32 by N. The output of the divider 45 is provided as a distribution clock ($CLK_3$) and also through a lumped delay element 46 to the other input of the AND gate 44. The output of the AND gate 44 is provided as one input to the reset phase comparator 22, with the other input of the comparator being taken from the output of the delay circuit 20.

In operation, the circuit of FIG. 3 receives $CLK_1$ at the input of the variable digital delay circuit 20 where through it is propagated. The output of one of the delay elements 40 is selected by activating one of the AND gates 30 through the provision of a DELAY signal. The activated AND gate therefore conducts $CLK_1$ delayed in phase (or in time) by an amount determined by the number of delay elements through which $CLK_1$ is conducted to the active AND gate. The delayed form of $CLK_1$ is provided as a corrected clock $CLK_{1C}$ through the output of the OR circuit 32. The corrected clock $CLK_{1C}$ is divided by the circuit 45 and conducted through the delay circuit 46 whence it is provided as the reference signal $REF_1$. The phase of $REF_1$ relative to the phase of $REF_2$ thus represents the phase of $CLK_1$ relative to the phase of $CLK_2$. The relative phase is measured and indicated by the phase comparator 14. The output of the comparator is provided in the form of a CONTROL pulse by one of the pulse generators 24a or 24b to the shift synchronization circuit 26. The shift synchronization circuit 26 conducts the CONTROL signal through a phase shift circuit corresponding with the circuit 20 so that the provision of shift control pulses to the storage elements of the shift register 16 is synchronized with the passage of $CLK_1$ through the delay circuit 20. Eventually, the control signal will be conducted to the storage element currently holding the delay token signal. When this occurs, the delay token signal will be shifted to an adjacent storage element. When the token is shifted, the DELAY signal provided by the storage element from which the token is shifted will inactivate, while the DELAY signal output by the element to which the token is shifted will activate. Thus, control will be shifted from the AND gate from which the DELAY signal is removed to the adjacent AND gate, whose DELAY control signal is activated.

Since control is passed from one of the AND gates 30 to an adjacent one, it will be evident that one unit of delay will be either added to or deleted from $CLK_1$, thereby changing the phases of $CLK_{1C}$ and $REF_1$. Such insertion or removal corresponds to a single delay event illustrated in FIG. 2.

Continuing with the description of operation of FIG. 3, the reset phase comparator 22 compares the phase of $CLK_{1C}$ with a reference phase of $CLK_1$ indicated in FIG. 3 as $CLK_{1CNT}$. In this regard, the subscript "CNT" refers to the centermost delay element 40 in the variable digital delay circuit 20. The comparator thus compares the phase of the instantaneously-corrected clock signal $CLK_{1C}$ with the phase of $CLK_{1CNT}$ and provides the RESET signal when those phases are aligned. In practice, the total delay through the variable digital delay circuit 20 is selected to be equivalent to at least two periods of $CLK_1$. Thus, a lumped delay of at least two periods of $CLK_1$ extends on either side of the centermost element comparator 22 detects when $CLK_{1C}$ has circuit 20. The phase comparator 22 detects when $CLK_{1C}$ has been subjected to enough delay increments to shift it in phase to be equal to $CLK_{1CNT}$. When this occurs, the shift register 16 is reset to the centermost storage element, thereby selecting $CLK_{1CNT}$ as the output of the OR circuit 32. This changes the source of $CLK_{1C}$, without changing its phase. The effect is to provide an apparently infinite amount of incremental delay by which to adjust $CLK_1$. Stated another way, the sequence of delay signals generated by the shift register 16 sequentially increments the delay in $CLK_1$ until a predetermined reference phase, equivalent to the phase of $CLK_{1CNT}$, is reached, whereupon the sequence is reinitialized by changing the phase of $CLK_{1C}$ to that of $CLK_{1CNT}$.

$CLK_{1CNT}$ is provided through the AND gate 44 to the comparator 22 only when the gate is activated by the positive level of $REF_2$. This permits the gate 44 to sample $CLK_{1CNT}$ only at intervals determined by $REF_1$.

The delays 43 and 46 are inserted into the circuit paths of $CLK_{1CNT}$ and $REF_1$ in order to equalize their arrival time at the AND gate 44. The delay 42 accounts for the throughput time to the output of the phase comparator 14.

Figure 4:
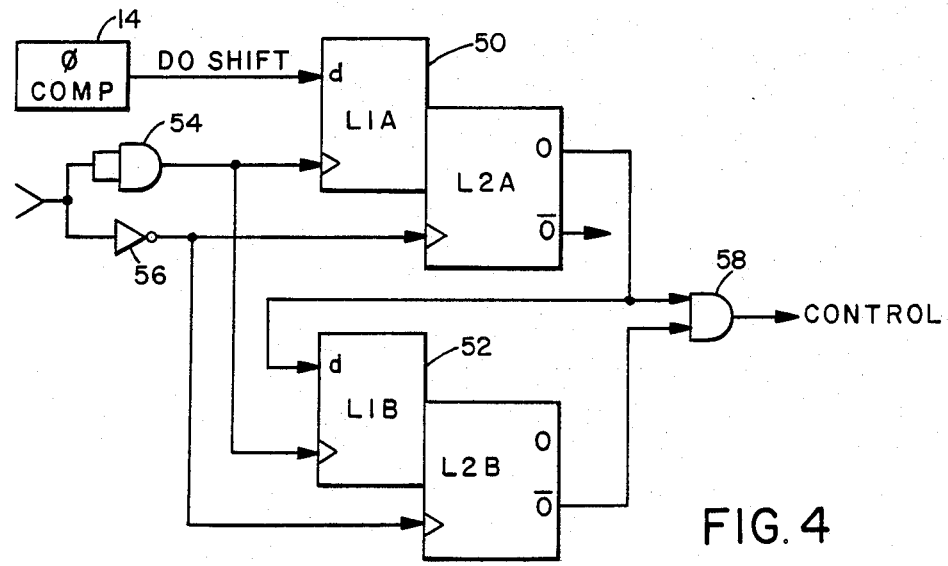
FIG. 4 is a more detailed illustration of a pulse generator of FIG. 3.

FIGS. 4 and 6 illustrate the structure and operation, respectively, of each of the pulse generators 24a and 24b. Each pulse generator consists of a pair of phased latches of the level sensitive scan design (LSSD) variety in which a data signal is presented to the data (d) input of the latch and shifted sequentially from a first latch stage (I) to a second latch stage (2) in response to respective clocks input to those stages. The latches of the FIG. 4 generator are indicated by 50 and 52, with the respective stages of the latch 50 indicated by L1A and L2A and the stages of the latch 52 by L1B and L2B. Each of the latches 50 and 52 provides the positive sense of its output through a port O and the negative sense through a port ō. The positive output of the latch 50 and the negative output of the latch 52 are collected in a conventional AND gate 58. The phased clock signals to the latches 50 and 52 are developed from $CLK_{1C}$ though a circuit consisting of a conventional AND gate 54 and a conventional digital inverter 6. The purpose of the parallel circuit comprising the elements 54 and 56 is to present equal delays to the positive and negative sense of $CLK_{1C}$. The positive sense of $CLK_{1C}$ is provided through the AND gate 54 to the first stages of the latches 50 and 52, while the inverted version of $CLK_{1C}$ is provided through the inverter 56 to the second stages of the latches. The input to the first stage of the latch 50 is provided from one of the outputs of the comparator 14, while the data input to the latch 52 is taken from the positive output sense of the latch 50.

The operation of the pulse generator of FIG. 4 is shown in FIG. 6. Assuming a phase difference signal is activated by the phase comparator 14, indicating a phase difference, the high level of $CLK_{1C}$ causes the first stage of the latch 50 to follow the rising edge 59 of the DO SHIFT pulse. The negative edge 60 of $CLK_{1C}$, inverted by the inverter 56 to clock the second stage of the latch 50, moves the DO SHIFT level to the output 0 of the latch 50. At this time, the negative output of the latch 52 is positive, causing the control signal to be emitted by the AND gate 58. Thus, the control signal is generated following the negative edge 60 of $CLK_{1C}$. Since the positive output of the latch 50 is fed forward into the latch 52, the inverse output, $\bar{o}$, of latch 52 will fall following the negative-going edge 62 of $CLK_{1C}$, deactivating the CONTROL signal.

Figure 5:
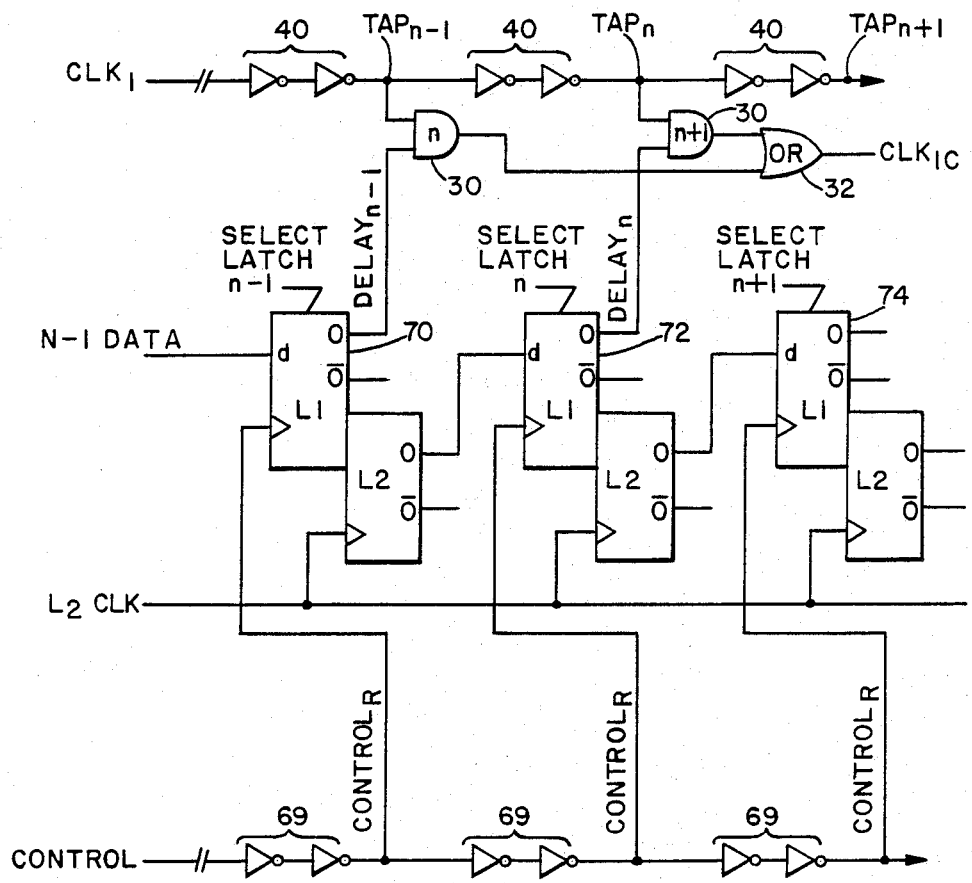
FIG. 5 is a more detailed schematic of a shift synchronizing element of FIG. 3.

FIGS. 5 and 7 illustrate how the control pulse generated by one of the pulse generators 24a or 24b is synchronized with the provision of $CLK_1$ to the delay circuit 20 in such manner that the state of the shift register 16 does not change while $CLK_{1C}$ is active. In FIG. 5, the shift synchronization circuit 26 is a sequence of serially-connected delay elements 69 equivalent to the delay elements 40 which make up the variable digital delay circuit 20. A portion of the shift register 16 for shifting a delay token to the right when $CLK_1$ leaves $CLK_2$ is illustrated as including LSSD latch pairs 70, 72, and 74. Assume that latch 72 holds the delay token signal, AND gate 30 (representing $TAP_n$ of the delay circuit 20) is active and that OR gate 32 is providing $CLK_1$, obtained from $TAP_n$ of the delay circuit 20, as $CLK_{1C}$. Next, assume that the control signal generation scenario of FIG. 6 has occurred, with $CLK_1$ being provided through AND gate 30, denoted as $CLK_{1n}$ in FIG. 7. Finally, assume that the clock for the L2 stages of the latches, although not shown, would be controlled to be active at a time that the CONTROL pulse was not propagating through the shift synchronizing circuit 26. The negative transition 60a of $CLK_1$ arrives at $TAP_n$ of the delay circuit 20 shortly before the control pulse arrives at $TAP_n$ of the shift synchronization circuit, where it is provided to the latch 72 as $CONTROL_n$. Since $CLK_1$ and the CONTROL pulse move through essentially identical delay circuits, the edge 60a of $CLK_{1n}$ and the edge 64a of the CONTROL pulse will have the same phase relationship as in FIG. 6, thereby enabling the CONTROL pulse edge 64a to shift the delay token signal from the latch 720 to the latch 74 as shown in the edge transitions 66 and 68. When the DELAY$_n$ signal provided by the latch 72 deactivates (transition 66), the AD gate n is inactivated, while the next AND gate to the right of it ($AND_{n+1}$, not shown) is activated (transition 68 in $DELAY_{n+1}$) The outputs of the AND gates are combined by the OR gate 32 to provide a continuous $CLK_{1C}$ signal with an element of delay added as shown. Thus, the provision of the control function through the shift synchronization circuit 26 synchronizes it with the transition in $CLK_1$ which generated it. The CONTROL bit is propagated such that it acts to change the state of the shift register 16 only when the $CLK_1$ signal is inactive at the TAP of the variable digital delay circuit to be moved.

It will be evident to those skilled in the art that the propagation of the CONTROL pulse will operate to synchronize both a reset of the register 16 and a one position shift in TAP selection. Although FIG. 5 illustrates essentially a lead shift synchronization, the data path controls for causing a lag (shift left) to remove delay, as well as the data path controls for establishing a reset condition work in the shift register 16 in a manner similar to that illustrated and described in connection with FIG. 5, and are common knowledge to logic designers.

Returning to FIG. 3, it should be evident that the phase correcting feature of this circuit provides the ability to synchronize the oscillator 10 to the oscillator 2 without affecting the oscillator 12. This implies that if the oscillator 12 operates as "master" oscillator, the act of synchronizing the oscillator 10 to it would not affect the operation of the master. Further, it also implies that any number of "slaves" could be synchronized to the one "master." Thus, the phase compensation function performed by the circuit of FIG. 3, which is usually associated with communication or data handling tasks, now is moved to the logic control task. Since the circuit of FIG. 3 is formed from digital components, it can be fully integrated on the same circuit chips with the rest of the logic which it controls.

It is reasonable to assume independent crystal oscillators such as the oscillators 10 and 12 for the slave and master units. Further, it should be assumed that the variability or difference in frequency between the oscillators 10 and 12 is small. Those skilled in the art will realize that crystal controlled oscillators can be shifted in frequencies by small amounts through variable capacitance tuning employing varactor diodes and other, similar elements. However, in such cases, the all-digital objective of the invention would not be met. Instead, in the invention the oscillator 10 (the "slave" oscillator) is allowed to drift relative to the "master" oscillator (the oscillator 12) while the phase-lock signal $REF_2$ is delivered to the slave logic. In most cases, it will be desirable for the frequencies of the reference signals $REF_1$ and $REF_2$ to be equal to some integer division (such as 1/16) of their respective oscillator frequencies, in order to reduce the difficulty of propagating the signals.

Figure 8:
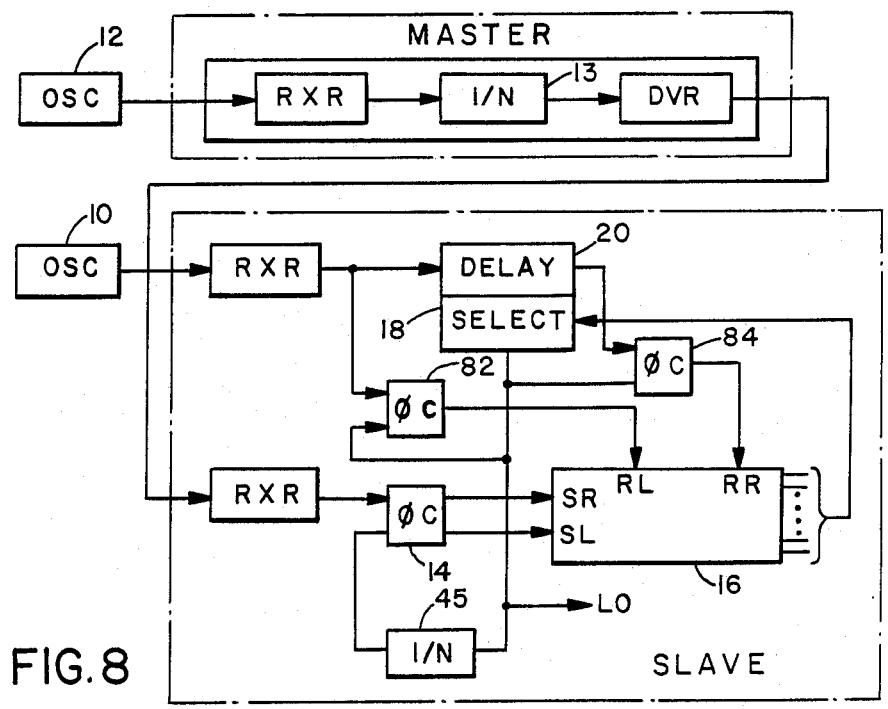
FIG. 8 is a block diagram illustrating a specific implementation of the invention in synchronizing the operations of master and slave logic circuits.

FIG. 3 essentially illustrates the synchronization of the slave oscillator 10 with a master oscillator 12. Another variation of the master/slave arrangement is illustrated in FIG. 8. In FIG. 8, the elements 10, 12, 13, 14, 16, 18, 20, and 45 are functionally equivalent to the identically-referenced elements in FIG. 3. However, in FIG. 8 the delay circuit 20 has only half the number of delay elements and provides a total delay of slightly more than one period of $CLK_1$. The shift register 16 can still shift left or right according to the CONTROL signal generated by the comparator 14, however, the register 16 has half as many storage elements as the register 16 in F 3, and further can be reset to the extreme lefthand (RL) or extreme righthand (RR) element. In addition, the circuit of FIG. 8 includes two phase comparators 82 and 84, each comparing the corrected clock signal CLK1C with a respective reference phase of $CLK_1$ The phase comparator 82 compares the currently-selected phase of $CLK_{1C}$ with $CLK_1$ unshifted, and thus compares the corrected version of the clock against its zero-phase representation. Thus, as delay is added to $CLK_1$ by shifting the delay token to the right in the register 16, the register will be reset to the extreme left-hand position, inserting the minimum phase delay in $CLK_1$, as $CLK_{1C}$ comes into phase with $CLK_1$. Similarly, the phase comparator 84 compares the currently-delayed waveform with the maximally-delayed waveform, and resets the shift register 16 to the extreme righthand storage element when the phase of the corrected waveform equals that of the maximally-delayed waveform. Thus, when $CLK_1$ lags the master clock generated by the oscillator 12, delay is incrementally removed from $CLK_{1C}$ by moving the shift token in the register 6 to the left, with the procedure being reinitiated by a reset to the right in the register 16 when $CLK_{1C}$ equals the maximally-shifted clock waveform in phase.

Figure 9:
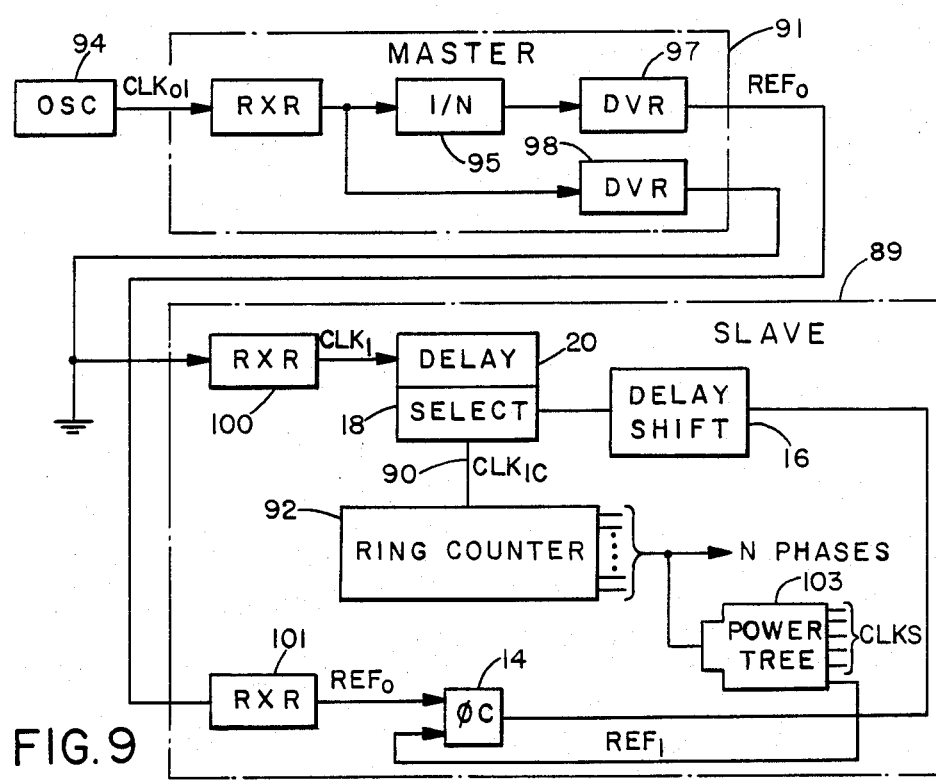
FIG. 9 is a block diagram illustrating the use of the invention in synchronizing inter-chip functions between a pair of integrated circuits.

FIG. 9 illustrates the use of a phase correction circuit consisting of elements 14, 16, 18, and 20 corresponding to their identically-numbered counterparts in FIG. 3, with the exception that the comparator 14 measures phase difference in only a single direction and the shift register 16 shifts in that single direction. The corrected waveform $CLK_{1C}$ is output on signal line 90 and provided to a ring counter 92, which essentially performs the 1/N division necessary to obtain the reference signal of the local phase comparator 14. In FIG. 9, it is assumed that a single clock is distributed from a master integrated circuit 91 to the slave integrated circuit 89 for synchronization of digital functions performed by the slave circuit. In this context, no independent oscillator signal is provided to the slave circuit 89. Instead, $CLK_1$ is provided as a distributed clock whose genesis is the oscillator 94 providing $CLK_{1C}$ which is received by the master circuit 91 and divided by the 1/N dividing circuit 95. The divided clock is passed through a driver 97 to provide the reference $REF_0$ which is fed through the receiver 101 to be compared against $REF_1$ by the phase comparator 14. The undivided clock is distributed through the driver 98 and is received by the slave circuit 89 through a receiver 100. The clock out of the receiver 100 is relabeled as $CLK_1$, which serves as the source clock waveform for all functions on the slave circuit 89. The phase-corrected version of $CLK_1$, that is $CLK_{1C}$, is divided by N through the ring counter 92 and distributed to other logical functions on the slave circuit 89 through a conventional clock distribution power tree 103. One of the clocks distributed through the power tree 103 is fed back to the phase comparator 14 as $REF_1$.

The inventive embodiment illustrated in FIG. 9 is effective to compensate for skew imposed on a master clock distributed to a plurality of slave integrated circuits such as 89. For example, a logic assembly that is made up of a number of LSI circuit chips that must work in synchronism at a speed that approaches the switching speed of the logic on the chips is affected by the distribution of $CLK_0$ to the slave chips. Circuit chips that contain 20,000 to 40,000 cells will require 4 to 6 levels of clock signal repowering in order to provide enough drive capability for all of the circuit loads involved. Each level imposes a certain amount of delay in the propagated clock signal. The intercircuit drivers and receivers also contribute to this delay. The normal procedure based upon generating a clock signal in one location (the master circuit 93) and distributing it as needed to and through slave circuits, produces in a clock signal skew between circuits resulting from the total delay through the circuit path and the tracking precision of the technology between the chips. Interchip skew can be as bad as one-half the worst case propagation delay or more. In FIG. 9, a single reference oscillator 94 provides the frequency precision required for logic circuit operation in the form of $CLK_0$. The lower frequency reference signal $REF_0$ is generated on the master chip 93 and distributed to all slave chips, together with $CLK_0$. Each of the slave circuits, such as the circuit 89, provides the adjustable delay described above to align the circuit clock ($CLK_1$) with the distributed clock ($CLK_0$). Initially, the ring counter 92 will be inactivated and the shift register 16 set to minimum delay. The counter 92 will be activated with the arrival of the reference signal $REF_0$, allowed to run freely thereafter, and then stepped by the repowered clock signal $CLK_{1C}$. By starting the ring counter 92 away from the end of a cycle, it will be possible to ensure that the local phase, indicated by $REF_1$, always initially leads the reference phase $REF_0$. While comparing the trailing edges of the reference and local phases, delay can be added one element at a time until a match is made. Once this alignment is accomplished, no further action is necessary unless the frequency of the distributed clock ($CLK_0$) is affected by changes in operating conditions such as temperature or power supply. The benefits derived from the configuration of FIG. 9 are manifold. Since there is no need for active phase compensation while the logic on the chip is in operation, the shift register 16 can comprise a simple binary counter, without the requirement for the shift synchronization of FIG. 3. Since phase correction action is always accomplished from one direction over a limited range of phase error, the phase comparator 101 can be as simple a circuit as a polarity hold latch. Multiple slave chips can be synchronized to the reference $REF_0$, permitting an arbitrary number of chips to work together in relative synchronicity. Further, failure of nay one slave chip's phase compensation circuit will not cause disturbance to any other slave chip. Finally, continuous monitoring of the state of phase equilibrium on each chip permits fault isolation at the failing chip and enhances the visibility of errors.

Figure 10:
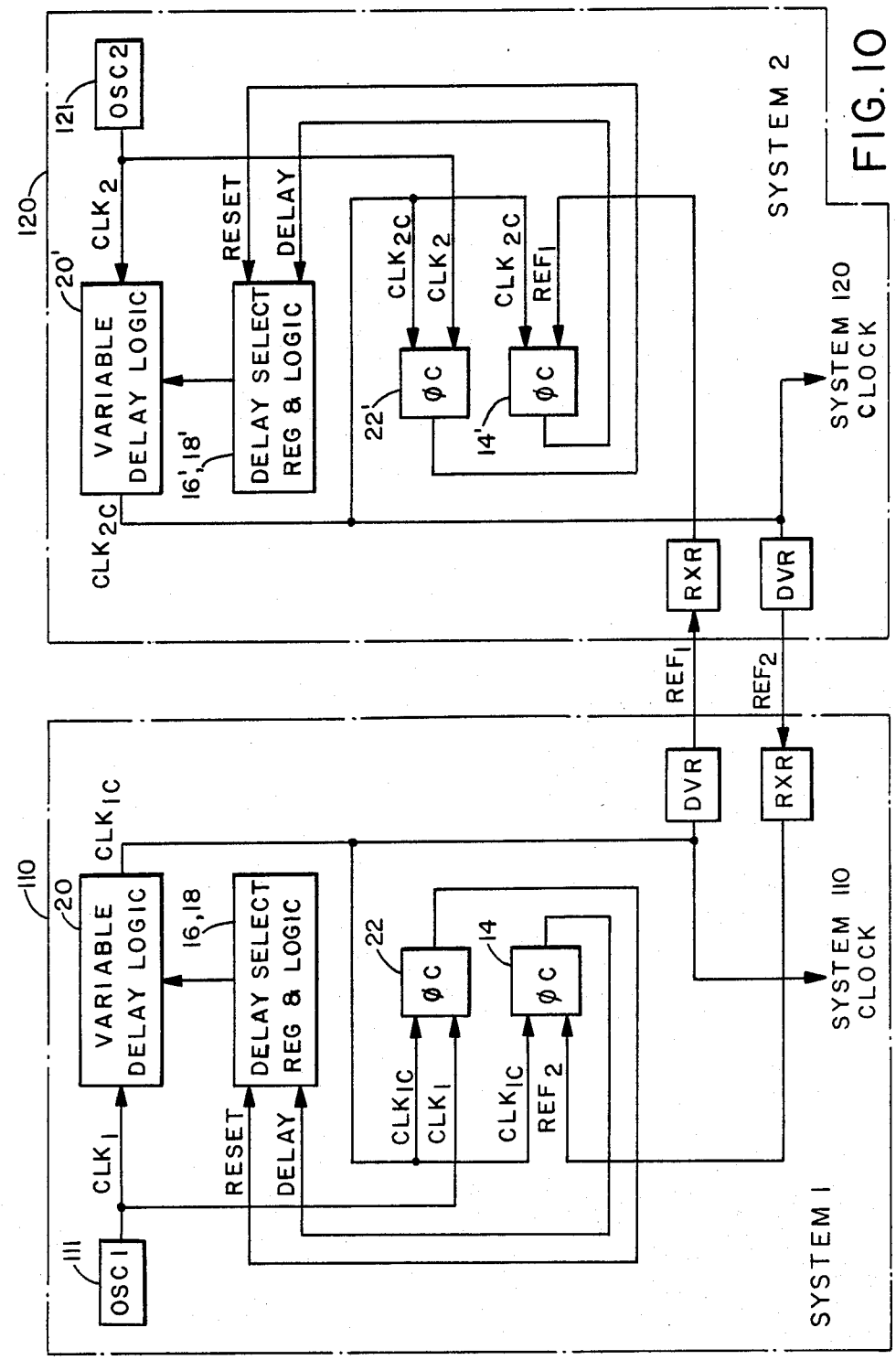
FIG. 10 is a block diagram illustrating the use of the invention in synchronizing the operations of a pair of separate logic systems.

The FIG. 10 illustrates employment of the inventive principles embodied in FIG. 3 in the context of a pair of autonomous digital systems 110 and 120 whose respective operations are controlled and synchronized by clocks derived from oscillators 111 and 121. Based on trends in industry, there is an increasing need to synchronize the two independent clocking sources to support the use of dual system configurations. Such configurations are favored, as they provide built-in redundancies, and thereby achieve higher levels of availability and reliability. Further, when there exists a requirement for communication between two such systems, it is advantageous to employ synchronized clocking to maximize the performance and reduce hardware complexity and costs. In the past, synchronization of such systems has been accomplished by distribution of a single clock to both systems. This achieves synchronicity, but is a troublesome solution in that introduces a single point of failure to the configuration. Providing an independent oscillator to each system, and employing the method of the invention to synchronize the oscillators, achieves the goals of maximum performance, availability, and reliability. Further, use of the above-taught principles permits synchronization to be implemented in digital, rather than analog, circuitry, which provides the benefits of less costly test procedures. As is known, analog designs typically require manually generated test patterns in the use of unique test equipment. These factors translate into added test time and increased production cost. Digital implementations, however, can employ structure design techniques which allow a higher degree of test the associated functions of the overall systems.

The embodiment of FIG. 10 therefore assumes the two autonomous digital systems 110 and 120, each incorporating a digital phase compensation circuit according to the above teachings. In system 110 of FIG. 10, a delay select logic circuit includes the shift register 16 and select logic 18 described above, the variable digital delay circuit 10, also described above, as well as the local phase comparator 14 and reset phase comparator 22, both also corresponding to identically-numbered elements of FIG. 3. The elements 14 locations of the identically-referenced elements in the system 110. Each of the systems 110 and 120 performs the phase compensation in response to measurement performed directly upon uncompensated and compensated clock waveforms. In addition, the compensated clock waveforms are exchanged by the systems to provide reference ($REF_1$ and $REF_2$) against which to compare the local compensated clock waveform. Thus, for example, in the system 110 the local phase comparator 14 compares the local corrected clock $CLK_{1C}$ with the corrected clock $CLK_{2C}$ of the system 120. Thus, phase compensation in each of the systems is performed in response to phase difference detected by the phase comparators 14 and 14' between the two compensated clock waveforms. In each case, the shift register in the delay select logic is reset when the locally-generated clock waveform in the local corrected clock waveform are in phase. As with the circuit introduce variable delays in the paths of the variable digital delay circuits 20 and 20' is controlled by the shift if, for example, the system 110 perceived that its locally compensated clock waveform $CLK_{1C}$ was leading the compensated waveform produced by 120, while the system 120 perceived the opposite. In this case, both systems would attempt to independently compensate for same phase misalignment, thereby introducing the possibility of oscillation. Limiting each system to correct only in one pre-ordained direction eliminates the instability. For example, when $CLK_{1C}$ leads $CLK_{2C}$, the compensation circuit of the system 110 Will add delay to $CLK_{1C}$ to bring the two waveforms into phase alignment, while the system 120 will take no action. With the addition of delay, the two clock waveforms will come into alignment. As illustrated in FIG. 10, it is the corrected clocks, $CLK_{1C}$ and $CLK_{2C}$, which are distributed within their respective systems for functional clocking.

Obviously, many variations of the described invention can be practiced without departing from the scope or spirit of the invention. Thus, it is to be understood that the descriptions and illustrations used in the Abstract and Specification do not limit the invention, nor do they exclude equivalents of the characteristics illustrated, described, or claimed. The invention is limited solely by the claims which follow:

We claim:

1. A digital phase lock loop for phase-aligning a first oscillator signal $CLK_1$ having a frequency $f_1$ and a second oscillator signal $CLK_2$ having a frequency $f_2 \simeq f_1$, comprising:
   a local digital phase comparator for comparing the phase of $CLK_2$ with the phase of a corrected oscillator signal $CLK_{lc}$, and for producing a delay control signal based upon said comparison;
   digital selection logic connected to said local digital phase comparator for generating delay signals in a delay signal sequence in response to a succession of delay control signals;
   a variable digital delay circuit for receiving $CLK_1$ and connected to said digital selection logic for producing $CLK_{1C}$ by adjusting the phase of $CLK_1$ by delaying $CLK_1$ an amount of time which changes with said delay signal sequence; and
   a reset digital phase comparator for comparing the phase of $CLK_{1C}$ with a $CLK_1$ reference phase signal produced by said variable digital delay circuit and for producing a reset signal when the phases of $CLK_{1C}$ and reference phase signal are substantially equal; and
   wherein said digital selection logic is connected to said reset digital phase comparator for generating a delay signal corresponding to a predetermined point in said delay signal sequence in response to said reset signal.

2. The digital phase lock loop of claim 1 Wherein said digital variable delay means includes:
   a series of digital delay elements;
   a plurality of AND elements, each having a first input connected to receive $CLK_1$ through a respective digital delay element, a second input connected to receive one delay signal in said sequence of delay signals, and an output; and
   an OR element for receiving the outputs of said AND elements and for generating $CLK_{1C}$ in response to said AND element outputs.

3. The digital phase lock loop of claim 1 wherein said digital selection means includes a multi-stage shift element which moves a delay token signal between adjacent shift stages in response to said control signal, each of said shift stages producing a respective delay signal in said delay signal sequence in response to said delay token signal.

4. The digital phase lock loop of claim 1 wherein said predetermined point is a delay signal sequence signal corresponding to said reference phase.

5. In a digital system including a first oscillator producing a first clock signal $CLK_1$ having a frequency $f_1$ and a second oscillator producing a second clock signal $CLK_2$ having a frequency $f_2 \simeq f_1$, an improvement for digitally synchronizing $CLK_1$ and $CLK_2$,
   the improvement comprising
   a master unit;
   a reference clock source in said master unit receiving $CLK_2$ and producing, in response, a phase reference signal $REF_2$ having a frequency $f_R = f_2/N$, wherein N is a positive integer, greater than one;
   a slave unit, separate from said master unit;
   a reference signal source in said slave unit receiving $CLK_1$ and producing, in response, a phase reference signal $REF_1$ having a frequency $f_{R1} = f_1/N$; and
   a digital phase lock loop in said slave unit, comprising:
   a local digital phase comparator for comparing the phases of $REF_1$ and $REF_2$ and for producing a delay control signal based upon said comparison;
   a digital selection means connected to said local digital phase comparator for generating delay signals in a delay signal sequence in response to a succession of delay control signals;
   a digital variable delay means for receiving $CLK_1$ and connected to said digital selection means for producing a clock signal $CLK_{1C}$ by delaying $CLK_1$ by an amount of time determined by said delay signal sequence;

said digital variable delay means including means for producing a reset reference signal by delaying $CLK_1$ by a predetermined amount of time;

a reset digital phase comparator for comparing the phase of $CLK_{1C}$ with said reset reference phase signal produced by said digital variable delay means and for producing a reset signal when the phases of $CLK_{1C}$ and said reset reference phase signal are substantially equal; and wherein said digital selection means is connected to said reset digital phase comparator for generating a delay signal corresponding to a predetermined point in said delay signal sequence in response to said reset signal.

6. In a digital system including an oscillator producing a clock signal $CLK_0$ having a frequency $f_0$, a first unit for performing digital functions and including a reference clock source receiving $CLK_0$ and producing, in response a phase reference signal $REF_0$ having a frequency $f_R = f_0/N$, wherein N is a positive integer, greater than one, and a second unit for performing digital functions in synchronism with the digital functions of the first unit, an improvement for synchronizing the functions of the second unit with the functions of the first unit;

the improvement comprising:
a clock signal source producing a clock signal $CLK_1$ with a frequency $f_1 \simeq f_0$; and in said second unit;
a local reference clock source for producing, in response to a signal $CLK_{1C}$ of frequency $f_{1C} = f_1$, a phase reference signal $REF_1$ having a frequency $F_{R1} = f_{1C}/N$;

a digital phase comparator for comparing the phase of $REF_0$ with the phase of $REF_1$, and for producing a delay control signal based upon said comparison;

a digital selection means connected to said digital phase comparator for generating delay signals in a delay signal sequence in response to a succession of delay control signals; and a digital variable delay means for receiving $CLK_1$ and connected to said digital selection means for producing $CLK_{1C}$ by delaying $CLK_1$ by an amount of time determined by said delay signal sequence.

7. An apparatus for synchronizing two independently-clocked digital system, comprising:

in the first of said systems;
a first oscillator producing a first clock signal $CLK_1$ having a frequency $f_1$;

a first digital phase comparator for comparing the phase of a first corrected clock signal $CLK_{1C}$ and a reference clock signal $REF_2$, and for producing a delay control signal based upon said comparison;

a digital selection means connected to said digital phase comparator for generating delay signals in a delay signal sequence in response to a succession of delay control signals; and a digital variable delay means receiving $CLK_1$ and connected to said digital selection means producing the corrected clock signal $CLK_{1C}$ by delaying $CLK_1$ by an amount of time determined by said delay signal sequence, wherein said first corrected clock signal $CLK_{1C}$ is provided by said first system as a system output $REF_1$, and, in the second of said systems:
a second oscillator producing a second clock signal $CLK_2$ having a frequency $f_2 \simeq f_1$;

a digital phase comparator for comparing the phase of a second corrected clock signal $CLK_{2C}$ with the phase of $REF_1$ and for producing a delay control signal based upon said comparison;

a digital selection means connected to said digital phase comparator for generating delay signals in a delay signal sequence in response to a succession of delay control signals; and a digital variable delay means for receiving said clock signal $CLK_2$ and connected to said digital selection means for producing the corrected clock signal $CLK_{2C}$ by delaying signal $CLK_2$ by an amount of time determined by said delay signal sequence; and wherein the corrected clock signal $CLK_{2C}$ is provided by said second system as a system output reference clock $REF_2$.

8. The apparatus of claim 7 further comprising
in said first system:
a reset phase comparator for comparing the phase of $CLK_{1C}$ with $CLK_1$ reference phase signal produced by said digital variable delay means and for producing a reset signal when the phases of $CLK_{1C}$ and said reference phase signal are substantially equal; and wherein said digital selection means is connected to said reset phase comparator for generating a delay signal at a predetermined point in said delay signal sequence in response to said reset signal; and in said second system:
a reset phase comparator for comparing the phase of $CLK_{2C}$ with a reference phase of $CLK_2$ and for producing a reset signal when the phases of $CLK_{2C}$ and $CLK_2$ are substantially equal; and wherein said digital selection means is connected to said reset phase comparator for generating a delay signal at a predetermined point in said delay signal sequence in response to said reset signal.

9. A method of phase-aligning a first oscillator signal $CLK_1$, having a frequency $f_1$, with a second oscillator signal $CLK_2$ having a frequency $f_2 \simeq f_1$, comprising the steps of:

during a succession of cycles of $CLK_2$, comparing the phase of $CLK_2$ with the phase of an oscillating signal $CLK_{1C}$ having a frequency $f_{1C} = f_1$, to produce a sequence of delay control signals;

delaying $CLK_1$ by an amount of time which is successively changed in response to said sequence delay of control signals providing $CLK_{1C}$ based upon said delaying step;
comparing the phase of $CLK_{1C}$ with a predetermined reference phase of $CLK_1$; and adjusting the amount of time by which $CLK_1$ is delayed to a predetermined amount corresponding to said reference phase when the phase of $CLK_{1C}$ equals the phase of $CLK_1$.

* * * * *

UNITED STATES PATENT AND TRADEMARK OFFICE
CERTIFICATE OF CORRECTION

PATENT NO. : 4,868,514

DATED : September 19, 1989

INVENTOR(S) : Azevedo et al

It is certified that error appears in the above-identified patent and that said Letters Patent is hereby corrected as shown below:

Claim 1, column 12, line 1, please insert --a-- before the first occurrence of "digital";

Col. 14,
    Claim 9, line 56, please insert --of-- after "sequence"; and
           line 57, please insert --;-- at the end of the line Col. 11,
    Claim 5, line 47, please insert --:-- after comprising Signed and Sealed this Twenty-seventh Day of November, 1990

Attest:

HARRY F. MANBECK, JR.

*Attesting Officer*       *Commissioner of Patents and Trademarks*